US009244783B2

(12) United States Patent
Wirthlin (10) Patent No.: US 9,244,783 B2
(45) Date of Patent: Jan. 26, 2016

(54) AUTOMATED CIRCUIT TRIPLICATION METHOD AND SYSTEM

(71) Applicant: Brigham Young University, Provo, UT (US)

(72) Inventor: Michael J. Wirthlin, Mapleton, UT (US)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 14/308,471

(22) Filed: Jun. 18, 2014

(65) Prior Publication Data

US 2014/0372817 A1    Dec. 18, 2014

Related U.S. Application Data

(60) Provisional application No. 61/836,531, filed on Jun. 18, 2013.

(51) Int. Cl.
*G06F 9/455* (2006.01)
*G06F 11/16* (2006.01)

(52) U.S. Cl.
CPC .................... *G06F 11/1608* (2013.01)

(58) Field of Classification Search
CPC .................... G06F 9/455; G06F 11/1608
USPC ............................................. 716/106
See application file for complete search history.

(56) References Cited

U.S. PATENT DOCUMENTS

| 6,253,365 | B1 | 6/2001 | Baldwin |
| 6,637,005 | B1 | 10/2003 | Kohnen |
| 7,284,229 | B1 | 10/2007 | Trimberger |
| 7,797,575 | B2 | 9/2010 | Clark et al. |
| 7,906,984 | B1 | 3/2011 | Montminy et al. |
| 7,958,394 | B1 | 6/2011 | Bridgford |
| 2013/0144589 | A1* | 6/2013 | Levi ............................ 703/14 |

FOREIGN PATENT DOCUMENTS

| EP | 0373523 | A2 | 6/1990 |
| EP | 0916119 | B1 | 12/2001 |
| EP | 1146423 | B1 | 1/2010 |
| WO | 03/098638 | A1 | 11/2003 |
| WO | 2004/077260 | A2 | 9/2004 |
| WO | 2007/063322 | A1 | 6/2007 |
| WO | 2014/205114 | A1 | 12/2014 |

OTHER PUBLICATIONS

Carmichael, "Triple Module Redundancy Design Techniqes for Virtex FPGAs", Technical report, XILINIX, XAPP197 (v1.0.1), Jul. 6, 2006, 37 pages.

(Continued)

*Primary Examiner* — Thuan Do
(74) *Attorney, Agent, or Firm* — Brake Hughes Bellermann LLP (57) ABSTRACT

In one general aspect, a non-transitory computer-readable storage medium can be configured to store instructions that when executed cause a processor to perform a process. The process can include defining a plurality of subsets from a representation of a circuit, and rank-ordering each subset from the plurality of subsets. The process can also include selecting at least one of the subsets for triplication based on the rank-ordering and a triplication condition.

22 Claims, 7 Drawing Sheets

(56) References Cited

OTHER PUBLICATIONS

Golshan et al., "SEU-Aware High-Level Data Path Synthesis and Layout Generation on SRAM-Based FPGAs", Computer-Aided Design of Integrated Circuits and Systems, IEEE Transactions, vol. 30 , No. 6, Jun. 2011, pp. 829-840.

Golshan et al., "SEU-Aware Resource Binding for Modular Redudancy Based Designs on FPGAs", Proceedings of the Conference on Design, Automation and Test in Europe (DATE '09), European Design and Automation Association 3001, Leuven, Belgium, 2009, pp. 1124-1129.

He et al., "Cost Aware Fault Tolerant Logic Synthesis in Presence of Soft Errors", Proceedings of the 20th symposium on Great lakes symposium on VLCI, ACM New York, NY, USA, 2010, pp. 151-154.

Johnson et al., "Voter Insertion Algorithms for FPGA Designs Using Triple Modular Redundancy", Proceedings of the 18th annual ACM/SIGDA international symposium on Field programmable gate arrays, Feb. 21-23, 2010, pp. 249-258.

Kastensmidt et al., "On the Optimal Design of Triple Modular Redundancy Logic for SRAM-based FPGAs", Proceedings of the Design, Automation and Test in Europe Conference and Exhibition, vol. 2, Mar. 7-11, 2005, pp. 1290-1295.

Katz et al, "SEU Hardening of Field Programmable Gate Arrays (FPGAs for Space Applications and Device Characterization", Nuclear Science, IEEE Transactions, vol. 41, No. 6, 1994, pp. 2179-2186.

Legat et al., "SEU Recovery Mechanism for SRAM-Based FPGAs", Design and Diagnostics of Electronic Circuits & Systems (DDECS), Nuclear Science, IEEE Transactions, vol. 59, No. 5, Oct. 2012, pp. 2562-2571.

Petrovic et al., "Design Methodology for Fault Tolerant ASICs", IEEE 15th International Symposium on Design and Diagnostics of Electronic Circuits & Systems (DDECS), 2012, pp. 8-11.

Pilotto et al., "Synchronizing Triple Modular Redundant Designs in Dynamic Partial Reconfiguration Applications", Proceeding SBCCI '08 Proceedings of the 21st annual on Integrated circuits and system design, ACM New York, NY, USA, 2008, pp. 199-204.

Pratt et al., "Fine-Grain SEU Mitigation for FPGAs Using Partial TMR", IEEE Transactions on Nuclear Science, vol. 55, No. 4, Aug. 2008, pp. 2274-2280.

Pratt et al., "Improving FPGA Design Robustness with Partial TMR", 44th Annual IEEE Proceedings on International Reliability Physics Symposium, 2006, pp. 226-232.

Ruano et al., "A Methodology for Automatic Insertion of Selective TMR in Digital Circuits by SEUs", Nuclear Science, IEEE Transactions, vol. 56 , No. 4, 2009, pp. 2091-2102.

Sterpone, "A New Timing Driven Placement Algorithm for Dependable Circuits on SRAM-based FPGAs", ACM Transactions on Reconfigurable Technology and Systems, vol. 4, Issue 1, No. 7, Dec. 2010 , 21 pages.

Sterpone et al., "A New Placement Algorithm for the Optimization of Fault Tolerant Circuits on Reconfigurable Devices", Proceedings of the 2008 workshop on Radiation effects and fault tolerance in nanometer technologies, New York, NY, USA, 2008, pp. 347-352.

Tian Ban, "A Simple Fault-Tolerant Digital Voter Circuit in TMR Nanoarchitectures", NEWCAS Conference (NEWCAS), 2010 8th IEEE International, 2010, pp. 269-272.

Vasudevan et al., "Implementation of a Triple Modular Redundant FPGA Based Safety Critical System for Reliable Software Execution", In Proceedings of the Eleventh Australian Workshop on Safety Critical Systems and software, vol. 69 (SCS '06), Tony Cant (Ed.), Australian Computer Society, Inc., Darlinghurst, Australia, 2007, pp. 113-119.

Wang et al., "Rad-hard/hi-rel FPGA", European Space Agency—Publications—Esa SP, vol. 395, 1997, pp. 251-258.

Wirthlin, "Improving the Reliability of FPGA Circuits Using Triple-Modular Redundancy (TMR) & Voter Placement", Proceedings of the 2004 ACM/SIGDA 12th international symposium on Field programmable gate arrays, ACM, New York, NY, USA, 2004, pp. 252-252.

"QuickPath Interconnect IP: Enhancing Intel Processors and Accelerating Critical Server Data Paths", Xilinx, Inc., 2012, 2 pages.

Advanced FPGA Synthesis, Precision RTL Plus, Mentor Graphics Corporation, 2010, 2 pages.

"FPGA Design Solution for High-Reliablity Applications", Synopsis, Inc., 2015, 4 pages.

International Search Report and Written Opinion received for International Application No. PCT/US2014/043005, mailed on Sep. 30, 2014, 10 pages.

\* cited by examiner

| Rank | Subset | Component |
|------|--------|-----------|
| P1 | B2 | A3 |
| P2 | B1 | A1 |
| P2 | B1 | A2 |
| P2 | B1 | A6 |
| P3 | B4 | A5 |
| P3 | B4 | A4 |
| P4 | B3 | A7 |
| P4 | B3 | A8 |

FIG. 7A

AUTOMATED CIRCUIT TRIPLICATION METHOD AND SYSTEM

RELATED APPLICATION

This application claims priority to and the benefit of U.S. Provisional Patent Application Ser. No. 61/836,531, filed on Jun. 18, 2013, entitled, "Circuit Triplication Method and System," which is incorporated herein by reference in its entirety.

TECHNICAL FIELD

This description relates to automated partial triple modular redundancy (pTMR).

BACKGROUND

Partial triple module redundancy (pTMR) of a circuit can be implemented to improve the reliability of portions of a circuit. Some known methods for implementing pTMR of portions of a circuit are manual, inefficient, and/or may not properly result in triplication of the portions of the circuit in a desirable fashion. Thus, a need exists for systems, methods, and apparatus to address the shortfalls of present technology, and to provide other new and innovative features.

SUMMARY

In one general aspect, a non-transitory computer-readable storage medium can be configured to store instructions that when executed cause a processor to perform a process. The process can include defining a plurality of subsets from a representation of a circuit, and rank-ordering each subset from the plurality of subsets. The process can also include selecting at least one of the subsets for triplication based on the rank-ordering and a triplication condition.

The details of one or more implementations are set forth in the accompanying drawings and the description below. Other features will be apparent from the description and drawings, and from the claims.

DETAILED DESCRIPTION

Figure 1:
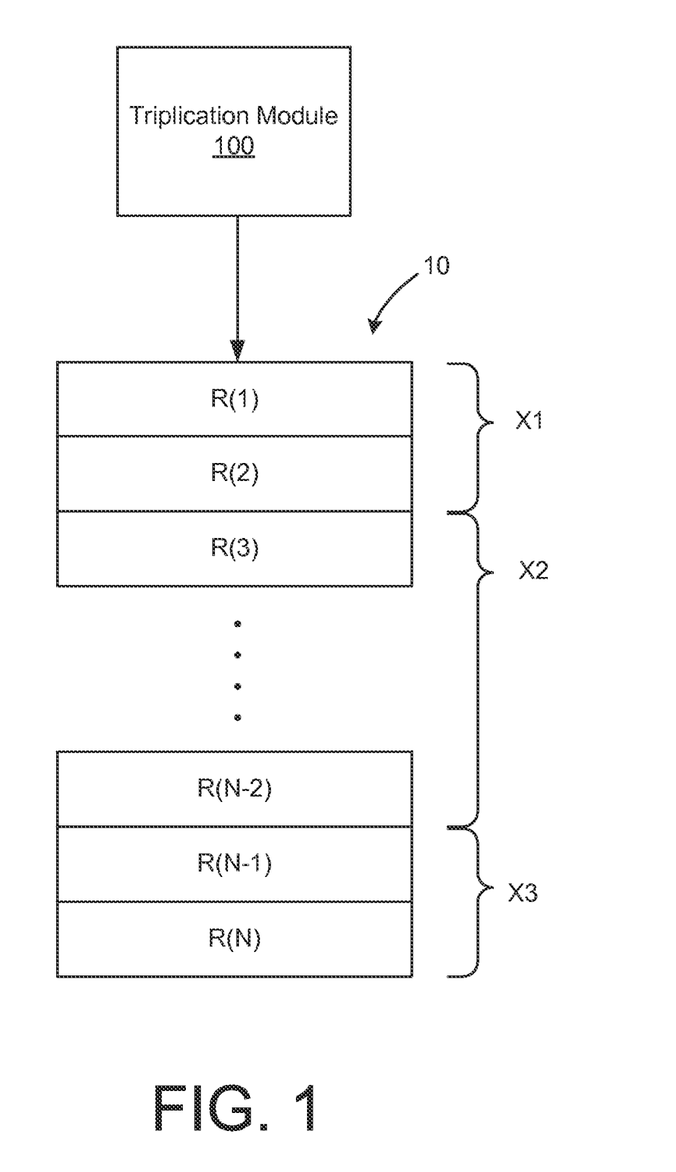
FIG. 1 is a block diagram that illustrates a triplication module and a circuit targeted for partial triple modular redundancy (pTMR).

FIG. 1 is a block diagram that illustrates a triplication module 100 and a representation of a circuit 10 (also can be referred to as a circuit representation) targeted for partial triple modular redundancy (pTMR) according to an implementation. The triplication module 100 is configured to automatically perform pTMR, which can be referred to as automated pTMR. Specifically, the triplication module 100 is configured to determine whether or not one or more elements R(1) through R(N) in the representation of the circuit 10 are to be triplicated. The elements R(1) through R(N) can represent circuit behaviors, components of a circuit, nodes, and/or so forth.

The triplication module 100 is configured to group the elements R(1) through R(N) into subsets based on one or more subset rules. In some implementations, the subsets can be referred to as clusters. In some implementations, the defining of subsets can generally be referred to as "subdividing". After the subsets have been defined (or identified), the subsets can be rank-ordered based on one or more ranking rules. In other words, a rank can be assigned to each of the subsets, or a portion thereof. In some implementations, the rank-ordering of subsets (or elements thereof) can generally be referred to as "rank-ordering". Based on the rank-ordering and one or more triplication conditions, one or more of the subsets of the elements R(1) through R(N) can be selected for triple modular redundancy. In some implementations, the subsets of the elements R(1) through R(N) can be selected for triple modular redundancy until a triplication condition is satisfied. In some implementations, the selecting of the subsets for triplication (and exclusion of other subsets from triplication) based on rank-ordering and triplication condition(s) can generally be referred to as "subset selection".

As a specific example, elements R(1) and R(2) can be defined as subset X1, elements R(3) through R(N−2) can be defined as subset X2, and elements R(N−1) and R(N) can be defined as subset X3. The subsets X1 through X3 can be defined based on, for example, connections and/or feedback cycles between the elements R(1) through R(N). The subsets X1 through X3 can be rank-ordered, for example, such that X2>X1>X3. The rank-ordering can be based on the relative importance of one or more of the elements R(1) through R(N) included within the subsets X1 through X3. After the rank-ordering has been completed, subsets X2 and X1 can be selected for triplication based on their respective ranks each being higher than a rank of X3 and a triplication condition that, for example, allows for triplication of only two subsets. Accordingly, subset X3 may not be selected for triplication because the triplication condition would be violated (or unsatisfied).

Although not shown in FIG. 1, one or more relationships can exist between pairs of elements R(1) through R(N). For example, a first element can be coupled to a second element via a relationship. The distance between the first element and the second element (which can be referred to as an adjacent element) can be referred to as a hop.

In some implementations, triplication can be used to preserve the internal memory or state of an element within a circuit cycle in the presence of a fault or upset. Triplication, along with voter insertion, can be implemented to automatically restore the correct memory state after a circuit has been repaired. Without triplication of feedback of the circuit cycle, the internal state of the circuit may be lost. Triplication of an element (e.g., a component, a node) can include replacing the element of a circuit with three instances (e.g., copies or replicates) of the element (or adding two instances of the element to the existing instance of the element). In some implementations, triplication can include insertion of one or more voters to ensure, for example, proper synchronization between instances (e.g., between the copies or replicates) of a triplicated element and other elements of a circuit that may or may not be triplicated. In some implementations, triplication can include insertion of one or more voters, for example, between a non-triplicated portion of a circuit and a triplicated portion of the circuit, portion of the circuit, within one or more feedback paths within each triplicated element (included in the triplicated portion), and/or so forth. More details related to, and an example of triplication, are described at least in connection with FIGS. 6A through 7B.

The triplication module 100, and implementation shown and described in connection with FIG. 1, are set forth by way of example only. A variety of circuit representation types, subset rules, ranking rules, and/or triplication conditions can be implemented by the triplication module 100. In some implementations, the subset rules, the ranking rules, and the triplication conditions can be collectively or individually referred to as parameters. More details related to these parameters are described below and in connection with at least FIG. 4.

Figure 2:
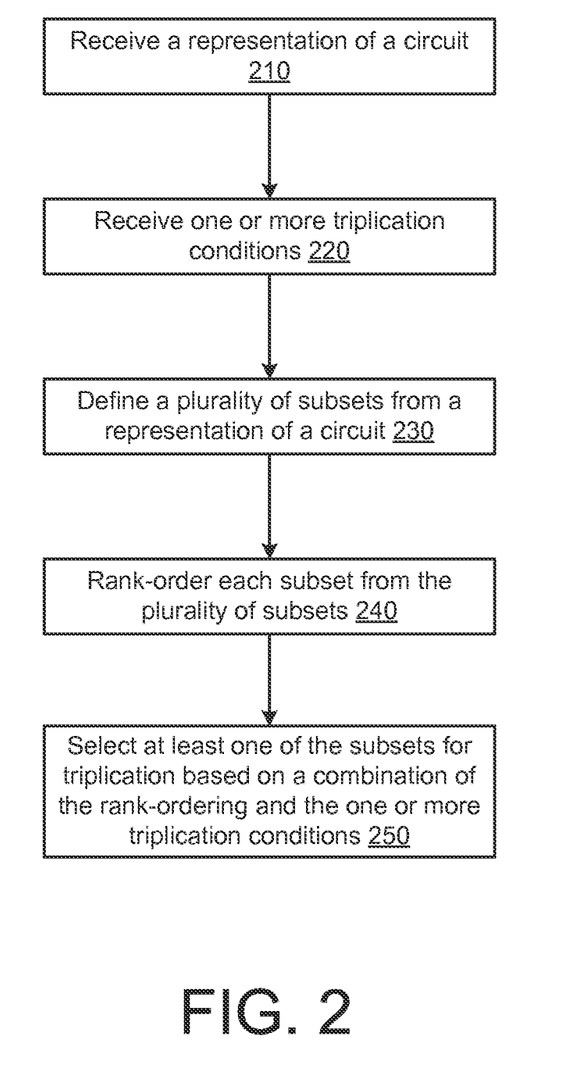
FIG. 2 is a flowchart that illustrates a process for performing automated pTMR.

FIG. 2 is a flowchart that illustrates a process for performing automated pTMR. As shown in FIG. 2, the triplication module is configured to receive a representation of a circuit (block 210). In some implementations, the representation of the circuit can be a textual representation of the circuit, a representation of behaviors of the circuit, a description of the circuit, a netlist, a graphical representation of the circuit, a hardware description language (HDL) level representation, architectural level representation, and/or so forth. The representation of the circuit can include elements (e.g., nodes, components, and/or so forth) and relationships between elements (e.g., physical connections, information flow, directions, endpoints, communication channels, and/or so forth).

As a more specific example, the representation of the circuit can include elements that represent the components of the circuit and relationships that represent the connections between the elements. In some implementations, a relationship between two of the elements can represent a directional relationship (e.g., a unidirectional relationship). In some implementations, a relationship between two elements can represent a bidirectional relationship.

FIG. 2 illustrates that one or more triplication conditions are received (block 220). The triplication condition can include a limit (also can be referred to as a threshold) for triplication such as a number of subsets that may be triplicated, a number of portions (e.g., components, elements) included in a subset that may be triplicated, an available size (e.g., die area, estimated area) for triplication, and/or so forth.

As shown in FIG. 2, the triplication module is configured to define a plurality of subsets from the representation of the circuit (block 230). The plurality of subsets can be defined based on one or more subset rules and an analysis of the representation of the circuit. In some implementations, the triplication module can be configured to analyze the representation of the circuit to determine the relative connectedness of components of the circuit based on the representation of the circuit. In some implementations, the automated methods for identifying the elements to triplicate can rely on the level of connectivity of the elements. In some implementations, the triplication module can be configured to define one or more of the plurality of subsets based on cycles (e.g., feedback cycles) included within the circuit (or representation thereof). Said differently, the defining of subsets can be based on an analysis of cycles within the representation of the circuit. In some implementations, a subset can be referred to as a group or grouping. In some implementations, a subset can include one or more elements.

After each of the plurality of subsets has been defined, each subset from the plurality of subsets is rank-ordered (block 240). The rank-ordering can be performed based on one or more ranking rules including size (e.g., die area, number of elements or sub elements) of the subset, complexity of the subset, relative priority of portions (e.g., components) of the subset, and/or so forth.

In some implementations, less than all of the plurality of subsets can be rank-ordered. For example, in some implementations only a portion of the subsets that are defined may be rank-ordered. For example, based on one or more a ranking rules, some subsets may be eliminated as a candidate for rank-ordering.

After the subsets have been rank-ordered, at least one of the subsets is selected for triplication based on a combination of the rank-ordering and the one or more triplication conditions (block 250). In some implementations, subsets from the plurality of subsets may be selected based on, priority defined by the rank-ordering, for triplication until a triplication condition is satisfied. For example, subsets from the plurality of subsets may be selected based on the rank-ordering until an area available for triplication has been satisfied or until a quota of a number of components for triplication has been satisfied. In some implementations, one or more triplication conditions, ranking rules, subset rules, and/or the representation of the circuit can be user-defined (e.g., designer-defined). In some implementations, one or more triplication conditions, ranking rules, subset rules, and/or the representation of the circuit can be based on, or can use, metadata associated with a circuit representation. More details related to metadata associated with a circuit representation are described below.

In some implementations, all or some portions of the process steps described above can be performed multiple times based on different sets of parameters (e.g., subset rules, ranking rules, and the triplication conditions) (or portion thereof) and/or circuit representations. For example, the entire process shown and described in connection with blocks 210 through 240 can be performed using a first set of parameters (e.g., subset rules, ranking rules, and the triplication conditions) (or portion thereof). Subsequently, the entire process shown and described in connection with blocks 210 through 240 can be performed using a second set of parameters (e.g., subset rules, ranking rules, and the triplication conditions) (or portion thereof). A comparison of the results can be performed by the triplication module to select the subsets (or portions thereof) for triplication.

In some implementations, all or some portions of the process steps described above can be iteratively performed or performed in a different order. For example, one or more triplication conditions can be received (block 220) after the subdividing (block 230) or the rank-ordering (block 240). In some implementations, one or more triplication conditions can be received (block 220) during the selecting (block 250).

As another example, the subdividing (block 230), the rank-ordering (block 240), and the selecting (block 250) can be iteratively performed based on different sets of parameters. In some implementations, the iterative processing in a subsequent iteration can be used to further refine processing during a prior iteration. In some implementations, the iterative processing can be performed so that different results of selected subsets can be compared from different iterations or processing time periods.

As a specific example, rank-ordering (block 240) can be performed during a first time period based on a first set of ranking rules, the selecting of subsets (block 250) can be performed during a second time period, and the rank-ordering (block 240) can be performed a second time during a third time period based on a second set of ranking rules. The rank-ordering during the third time period can be performed so that triplication conditions can be satisfied more completely (based on a threshold condition).

As another specific example, subdividing (block 230) can be performed during a first time period based on a first set of ranking rules, the rank-ordering (block 240) and selecting of subsets (block 250) can be performed during a second time period, and the subdividing (block 230) can be performed a second time during a third time period based on a second set of ranking rules. The subdividing during the third time period can be performed on a different portion of (e.g., mutually exclusive or overlapping portions of) the circuit than the subdividing during the first time period. In some implementations, the subdividing during the third time period can be performed so that subsets can be further subdivided (or grouped or combined) or so that one or more triplication conditions can be satisfied more completely (based on a threshold condition).

In some implementations, only one subset may be selected for triplication based on a triplication condition. In some implementations, a portion of the subset may be selected for triplication. More details related to such variations are described below.

Figure 3A:
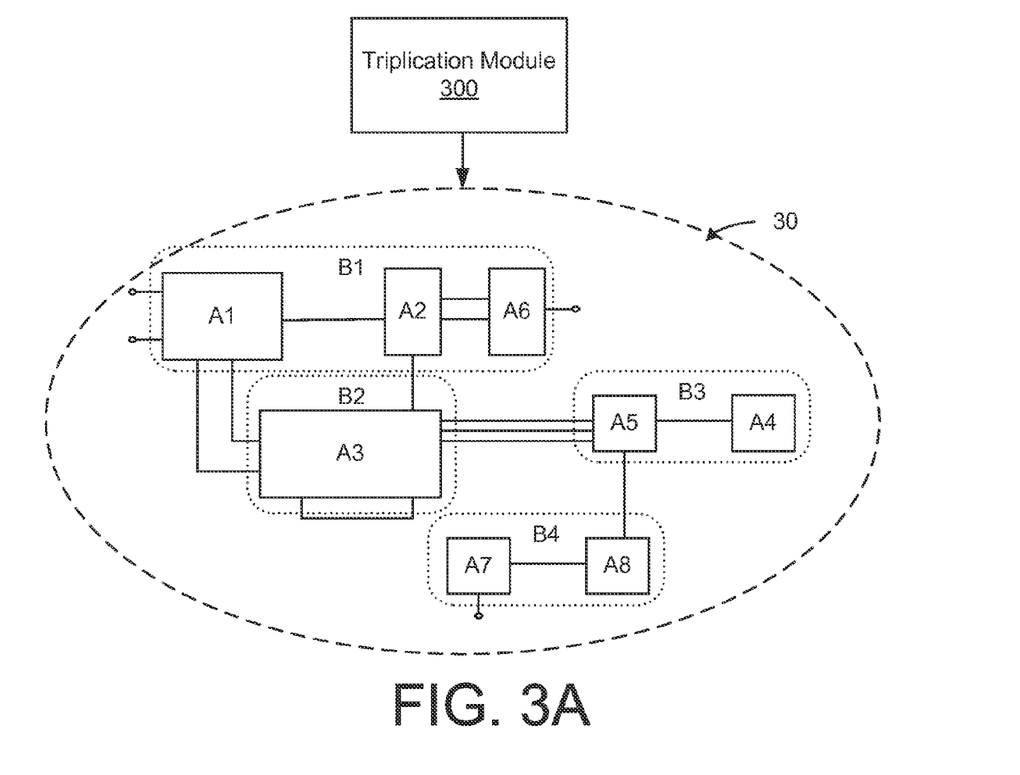
FIG. 3A is a block diagram that illustrates another triplication module and circuit targeted for pTMR.

FIG. 3A is a block diagram that illustrates another triplication module 300 and a circuit 30 targeted for automated pTMR according to an implementation. Specifically, the triplication module 300 is configured to determine whether or not one or more components A1 through A8 included in the circuit 30 are to be triplicated. In some implementations, the components A1 through A8 can be referred to as elements.

The components A1 through A8 can be referred to as primitive elements of the circuit 30. The components A1 through A8 can include elements such as flip-flops (FF), multiplexors, memory cells, invertors, logical gates (e.g., OR gates, AND gates, XOR gates), individual devices (e.g., diodes, metal-oxide-semiconductor field effect transistors MOSFETs), and/or so forth. As shown in FIG. 3A, the components A1 through A8 of the circuit 30 are coupled via electrical connections (or wires), which are represented as lines between the components A1 through A8. The circuit 30 shown in FIG. 3A is presented by way of example only, and the triplication module 300 can be configured to handle processing associated with a circuit that includes a large number of primitive circuit elements (e.g., over 100,000 circuit primitive elements).

The process of automated pTMR in accordance with FIG. 2 can be described with reference to FIG. 3A. For example, the triplication module 300 can be configured to receive a netlist (not shown) that is a representation of the components A1 through A8 and the connections included in circuit 30 shown in FIG. 3A. In some implementations, the netlist can indicate directionality of the connections between the components A1 through A8.

The triplication module 300 can be configured to define subsets B1 through B4 based on the netlist representation of the circuit 30. In some implementations, the subsets B1 through B4 can be defined based on cycles between the components A1 through A8 or a level of connections (e.g., number of connections, priority of connections) of the components A1 through A8 within the netlist representation of the circuit 30.

After the subsets B1 through B4 have been defined, the subsets B1 through B4 can be rank-ordered, for example, such that subset B2 has a rank P1 (also can be referred to as a priority), subset B1 has a rank P2, subset B4 has a rank P3, and subset B3 has a rank P4 (with P1 being highest and P4 being lowest). The rank-ordering of B2 with the rank P1 can be based on, for example, component A3 having a higher priority for triplication than any of the remaining components A1 through A2 or A4 through A8.

Figure 3B:
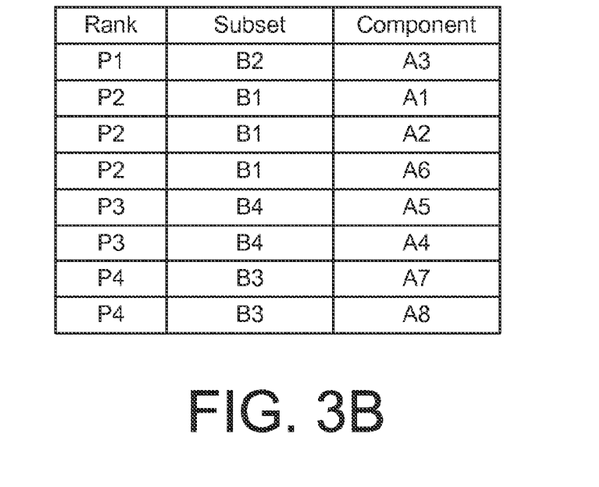
FIG. 3B is a table that illustrates rank-ordered components from FIG. 3A.

In some implementations, each of the components included in a rank-ordered subset can have the rank-ordering of the subset. For example, as shown in FIG. 3B, components A1, A2, and A6 each have the rank P2, which corresponds with the rank P2 of the subset B1.

After the rank-ordering has been completed, at least some of the components A1 through A8 from subsets B1 through B4 can be selected for triplication. In some implementations, selection of components (and exclusion of other components) based on rank-ordering can proceed until a triplication condition is satisfied. For example, if a triplication condition limits a number of components for triplication to four components, selection of the highest ranked subsets—subset B2 and subset B4—will satisfy the triplication condition. Specifically, subset B2, includes component A3, and subset B4, includes component A1, A2, and A6, for a total of four components.

As described above, as part of an automated pTMR process, the triplication module 300 can be configured to evaluate a list of components in a netlist and select which of these components should be triplicated and which should remain untriplicated. In some implementations, at the end of the automated pTMR process, a new netlist can be produced that can include more elements than the original netlist (e.g., some components from the original netlist can appear three times in the new pTMR netlist).

Figure 4:
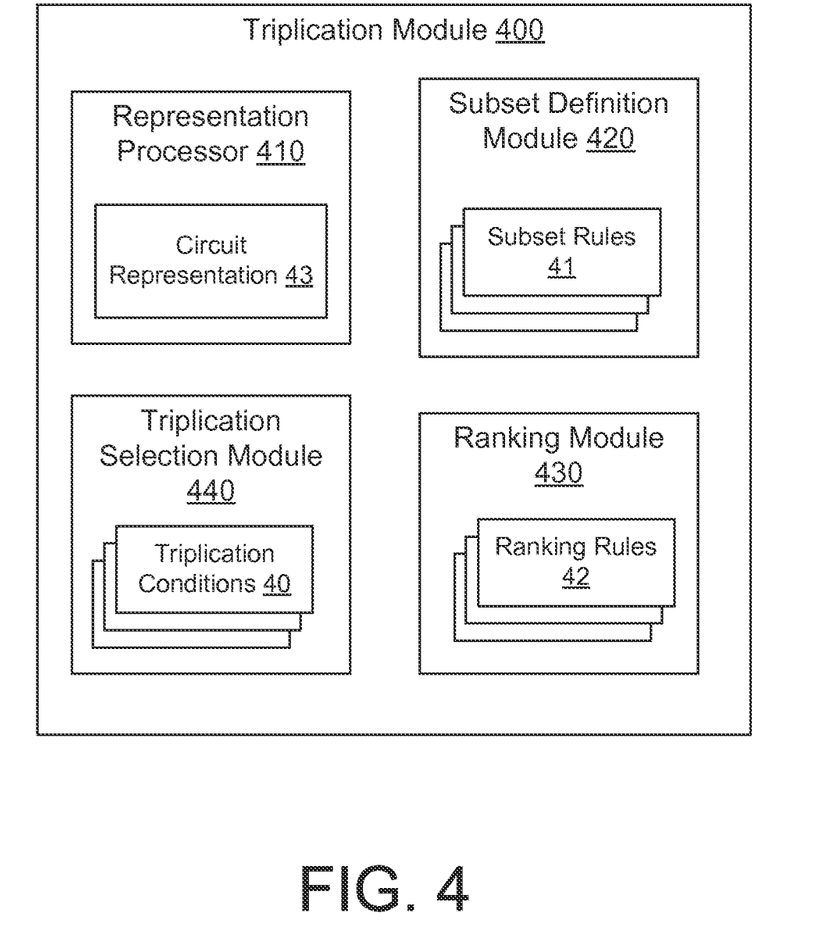
FIG. 4 is a block diagram that illustrates an implementation of a triplication module.

FIG. 4 is a block diagram that illustrates an implementation of a triplication module 400 according to an implementation. As shown in FIG. 4, the triplication module 400 includes a representation processor 410, a triplication selection module 440, a subset definition module 420, and a ranking module 430.

The representation processor 410 can be configured to process (e.g., produce, receive, analyze) a circuit representation 43 (or multiple circuit representations). In some implementations, the representation processor 410 can be configured to process any of the representations of a circuit as described herein. In some implementations, the representation processor 410 can be configured to define the circuit representation 43 based on a circuit input in a variety of formats. In some implementations, the representation processor 410 can be configured to convert a circuit representation (not shown) from a first format into the circuit representation 43, which can have a second format.

In some implementations, the representation processor 410 can include, or can use, a Computer Aided Design (CAD) tool that handles the circuit representation 43 (e.g., a netlist) as an input and then converts the circuit representation 43 into a low-level representation used to make the integrated circuit. In some implementations, the format of the circuit representation 43 can be implemented in an Electronic Design Interchange Format (EDIF). In some implementations, the circuit representation 43 can be, or can include, American Standard Code for Information Exchange (ASCII) text, a rich text format (RTF) and can be viewed using a text file editor. As a specific example, the representation processor 410 can be configured to process a netlist, which can be a computer file that describes the details of a circuit implementation. In some implementations, the format of the circuit can be implemented in a hardware description language (HDL).

In some implementations, the circuit representation 43 can include a list of all (or a portion of) circuit components in a circuit design. Each circuit component in the circuit representation 43 may represent a primitive component or element (such as those mentioned above) in target hardware or the circuit representation may refer to a previously defined circuit description that includes or references another circuit representation (not shown) to define a circuit hierarchy. In some implementations, a component can include a port that can be a connection point to one or more other components. Each component in the circuit representation 43 can be unique and can be referenced with a unique name. A component can have metadata (e.g., properties, annotations) that indicates to a processing tool (e.g., a CAD tool, the representation processor 410) a manner in which the component can or should be used.

The circuit representation 43 can also include a list of all (or a portion of) relationships (e.g., wires, connections, nets) in a circuit. A relationship can represent a physical connection between two or more component ports. In some implementations, a relationship can have one or more source (or driver) component and one or more sink components. In some implementations, a source port can be a port on a component that drives a logic value of a relationship (for example, the source might be the output of a logic gate). A sink ports can be a port of a component that receives (e.g., reads) the logic value of a relationship. A relationship can be simple with a single source and a single sink, or complex with multiple sources and hundreds of sinks. Like a component, a relationship can be identified with a unique name.

Figure 5:
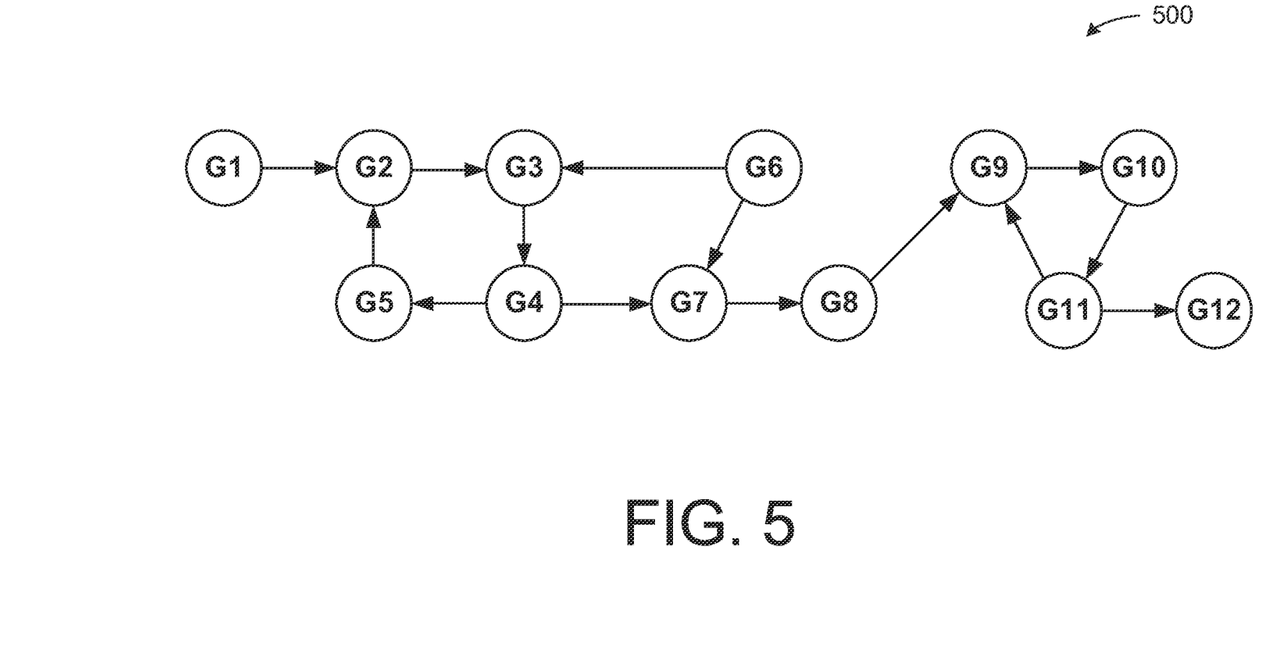
FIG. 5 is a diagram that illustrates a graphical representation of a circuit.

FIG. 5 is a diagram that illustrates a graphical representation of a circuit, which can also be referred to as a circuit graph 500. This circuit graph 500 (which can be referred to as a mathematical graph) includes 12 nodes (labeled G1 through G12) and fifteen edges. The circuit graph 500 can be a model consisting of nodes and edges to represent objects and their interconnection or level of connectivity. In some implementations, the nodes of the circuit graph 500 can be created for each circuit component, and the edges of the circuit graph 500 can be defined between each source-sink pair of each net in a circuit representation. In this implementation, the edges include at least: {G1,G2}, {G2,G3}, {G3,G4}, {G4,G5}, {G5,G2}, {G4,G7}, {G7,G8}, {G8,G6}, {G6,G7}, {G6,G3}, {G8,G9}, {G9,G10}, {G10,G11}, {G11,G9}, and {G11,G12}. The terms nodes and edges can be used, in particular, when used in conjunction with a circuit graph.

In some implementations, the nodes of the circuit graph 500 can correspond with components or elements. For example, each of the nodes in the circuit graph 500 can represent, for example, a logic gate or flip-flop of a circuit and the edges can represent, for example the network connections between these nodes. As another example, the nodes of the circuit graph 500 can correspond with circuit behaviors associated with elements, and the nets can represent connections or relationships between the elements. As yet another example, the nodes of the circuit graph 500 can correspond with components, and the nets can represent connections or relationships between the components. Accordingly, a circuit representation, such as a netlist, a behavioral representation of a circuit, and/or so forth, can be converted into a circuit graph such as the circuit graph 500 shown in FIG. 5 to facilitate the analysis of the circuit connectivity for triplication analysis.

Referring back to FIG. 4, the subset definition module 420 includes subset rules 41. The subset rules 41 can be used by the subset definition module 420 to the circuit representation 43. Specifically, the subset definition module 420 can use the subset rules 41 to define subsets (of elements, components, or nodes) within the circuit representation 43. Any of the subset rules 41 described herein associated with any of the implementation can be used alone or in combination. In some implementations, subset rules 41 can be organized with a prioritization (or ordering) so that a first subset rule from the subset rules 41 can be applied before a second subset rule from the subset rules 41. In some implementations, one or more of the subset rules 41 can include an execution order of other of the subset rules 41. In some implementations, one or more subset rules 41 may not be executed or may be dynamically changed during processing by the triplication module 400.

In some implementations, the subset rules 41 can be used to identify, or can include a rules-based algorithm for identifying, cycles within the circuit representation 43. For example, a cycle can be a path (e.g., an alternating sequence of nodes and edges) that starts and stops at the same node. A cycle within a circuit graph (such as that shown in FIG. 5) can also be referred to as feedback or as a feedback cycle. A cycle within a circuit graph can include a state (or a memory), where the state can be stored within a flip-flop or a register. A graphical example of a cycle is illustrated in the circuit graph 500 of FIG. 5 as: {G2,G3,G4,G5}.

In some implementations, the subset rules 41 can be used to identify a single cycle within a circuit representation as a subset, or can be used to identify multiple cycles for inclusion in a subset. In some implementations, the subset rules 41 can be defined so that each component, node, or element within a circuit representation 43 is included in only one subset. In some implementations, subsets identified using the subset definition module 420 can be mutually exclusive so that nodes, components, or elements are included in only one subset.

In some implementations, the subset rules 41 can be defined to identify subsets using Strongly Connected Component (SCC) decomposition. A strongly connected component can be a sub-graph (e.g., a subset of the original circuit graph) in which every node in the sub-graph can communicate with (or reach) every other node in the sub-graph. The subsets identified using SCC decomposition can be referred to as SCCs. By definition, a path that starts and stops at each node in the SCC indicates the presence of feedback or a cycle. At least the following SCCs are included in the circuit graph 500 shown in FIG. 5: {G2,G3,G4,G5,G6,G7,G8}, and {G9,G10,G11}. In some implementations, at least one cycle can be included in every SCC, and each node in a circuit graph may be included in only one SCC.

A number of algorithms can be used for identifying SCCs within a circuit graph such as Kosaruju's algorithm and Tarjan's algorithm. The Tarjan algorithm operates by performing two depth-first searches on a circuit graph and completes in linear time (meaning a linear relationship between the number of nodes in the graph and the execution time). The SCC decomposition can be used to define a list of SCCs where each SCC is a set of nodes forming circuit feedback.

In some implementations, the entirety of the circuit representation 43 (or relatively large portions thereof (e.g., greater than 50%)) can be identified as a subset using subset rules 41 targeted to cycles or SCC decomposition. In such instances, subset rules 41 can be applied by the subset definition module 420 to subdivide the subset into smaller subsets. Subset rules 41 related to a size (e.g., a percentage or ratio), numbers of elements, distance between elements, distance or hops along a path within a cycle, and/or so forth, can be used to limit or determine the size of a subset (e.g., limit the size of a subset to less than a specific percentage of the circuit representation 43).

For example, in some implementations, the entirety of the circuit representation 43 (or relatively large portions thereof) can be identified as an SCC. In other words, all circuit elements (or nodes or clusters) can be reached by the other elements in a feedback loop. To address this issue, a relatively large SCC can be decomposed (or subdivided) further by limiting the size of the SCC using one or more of the subset rules 41. Specifically, one or more of the subset rules 41 can be defined to identify clusters (referred to as SCC clusters) within a larger SCC where each SCC cluster has a number of elements where each element (or component or node) is limited in distance (e.g., number of hops) from other elements in the SCC cluster. As a specific example, with a modification to, for example, the Tarjan algorithm, SCC clusters can be identified from a larger SCC. This modified version of SCC decomposition, can be referred to as constrained-depth SCC decomposition because a relatively large, single SCC into a set of smaller SCC clusters where each cycle in the smaller SCC clusters has a limited path length.

In some implementations, the circuit representation 43 may lack cycles (or feedback cycles) such that relatively few subsets may be identified based on subset rules 41 targeting cycles. In such implementations, a variety of subset rules 41 can be implemented by subset definition module 420 to identify subsets.

For example, in some implementations, for circuit representations with relatively little or no feedback, subset rules 41 can be used to identify a subset using a seed element (or node or component) and/or fan-out levels (e.g., components that are driven by the seed element). Accordingly, a subset including feed-forward portions of a circuit representation can be identified. For example, a seed element can be identified and a specified number of fan-out levels from the seed element can be identified as a subset. In some implementations, this can be referred to as a wave-front search from the seed element. In some implementations, seed element can be identified in a specified number of fan-out levels and/or a specified number of elements (e.g., an element limit or threshold) can be identified as a subset.

In some implementations, the subset rules 41 can identify which elements should be selected as seed elements. For example, in some implementations, the subset rules 41 can indicate that a particular type of element, an element having a particular location, and/or so forth should be selected as a seed element. In some implementations, one or more elements can be randomly selected as a seed element. In some implementations, elements that have relatively high fan-out can be selected as a seed element for a subset. For example, a first element that has a fan-out to a higher number of elements than a number of elements to which a second element has a fan-out can be selected as a seed element over the second element.

In some implementations, one or more elements can be identified (e.g., within one or more of the subset rules 41) by a user as a seed element. For example, in some implementations, a user can provide a list of components and can provide each component with a score (or ranking) The triplication module 400 can be configured to defined subsets of components around these user-defined seed components.

In some implementations, one or more subset rules 41 can be used to identify subsets that are mutually connected. In other words, one or more of the subset rules 41 can be defined to verify or ensure mutual connection between elements (or nodes or components) that are included within a subset. For example, one or more subset rules 41 can be defined such that a specified (or threshold) number of mutual connections between at least two elements included in a subset. The elements that are included within the subset can be iteratively modified until the number of mutual connections between the at least two elements is satisfied. A mutual connection can be, or can include, a first connection from first element to a second element and a second connection from the second element back to the first element. The mutual connection be a type of cycle or feedback cycle.

Whether or not feedback is used to identify subsets (or elements) for triplication, one or more subset rules 41 can be defined so that elements that are identified for triplication are mutually connected as clusters or groups. The reason for cluster-based triplication is that it may be undesirable (e.g., relatively expensive) to provide voting between the triplicated portion of the design and the non-triplicated portion of the design (more discussion related to voting between triplicated portions is discussed below in connection with at least FIGS. 6A through 7B). By keeping all triplicated components in clusters, the number of voters needed to convert to the non-triplicated logic sections can be minimized. SCC decomposition, for example, can provide clustering in a desirable fashion, and some implementations using SCC decomposition can omit additional clustering rules (or algorithms).

In some implementations, one or more of the subset rules 41 can be configured to define subsets based on one or more circuit partitioning algorithms. In some implementations, circuit partitioning can be performed on relatively large circuits spread across multiple devices. The partitions of the circuit can be defined to subsets. In some implementations, one or more of the subset rules 41 can be defined to partition the circuit representation 43 to, for example, minimize communication between the partitions. In some implementations, these circuit partitioning algorithms can also be applied to create clusters of feed forward circuits that can be defined as subsets for triplication. In some implementations, one or more of the subset rules 41 can be configured to minimize the number of relationships that cross partition boundaries. In some implementations, reducing the number of relationships crossing partitions (or subsets) crossing can reduce a number of voters needed when crossing from a triplicated region or portion to a non-triplication region or portion.

For example, one or more subset rules 41 can be defined such that the first subset and a second subset can be defined to include elements that minimize a number of relationships or connections between the first subset and the second subset. As another example, one or more subset rules 41 can be defined such that a group of elements can be identified as a subset such that the subset has less than or equal to a threshold number of connections out of the subset. The elements that are included within the subset can be iteratively modified until the number of connections out of the subset is less than or equal to the threshold number. As yet another example, one or more subset rules 41 can be defined (e.g., iteratively define) such that a subset has a minimum number of connections out of the subset.

In some implementations, one or more of the subset rules 41 can be defined or customized by a user. In other words, at least one of the subset rules 41 can be defined by a user and used during automated pTMR by the triplication module 400. The user can identify, for example, sensitive regions of a circuit and can direct the TMR selection process using at least one of the subset rules 41. In some implementations, a user-defined rule can be prioritized over (or below) one or more of the other subset rules 41.

After the circuit representation 43 has been subdivided into subsets by the subset definition module 420 based on the subset rules 41, the ranking module 430 can be configured to rank-order the subsets based on one or more ranking rules 42. In some implementations, ranking rules 42 can be organized with a prioritization (or ordering) so that a first ranking rule from the ranking rules 42 can be applied before a second ranking rule from the ranking rules 42. Any of the ranking rules 42 described herein associated with any of the implementation can be used alone or in combination. In some implementations, one or more ranking rules 42 may not be executed or may be dynamically changed during processing by the triplication module 400.

In some implementations, at least one of the ranking rules 42 can be associated with a size. For example, at least one of the ranking rules 42 can be defined so that a subset including a greater number of elements has a higher or lower rank than a subset including a lesser number of elements. In some implementations, at least one of the ranking rules 42 can be defined so that a first subset that has a surface area (e.g., die surface area) larger than a surface area of the second subset can have a higher or lower rank than the second subset.

In some implementations, ranking rules 42 can include rules that are targeted to prioritization of elements included within a subset. For example, a first subset that includes a first type of element (or node or component) can have higher or lower rank than a second subset that includes a second type of element. As another example, elements can have, or can be assigned, a score that can be used to rank-order subsets including the elements. For example, relative rankings can be assigned to subsets based on mathematical combinations of scores of elements included within the subsets (e.g., average scores, median scores, maximum scores, minimum scores).

In some implementations, ranking rules 42 can include rules that are targeted to fan-out of elements included within a subset. For example, an element within a first subset that has a relationship (e.g., a net) that is associated with other elements outside of the first subset can be assigned a higher or lower ranking than a second subset that does not an element with a relationship that is associated with other components outside of the second subset. As a specific example, a relative rank-ordering of an SCC with respect to the other SCCs can be based on a fan-out or number of relationships that exit from the SCC. The fan-out can be used to identifying an influence impact of an element (or subset thereof). Elements that have a relatively large fan-out can provide the input for a large number of other elements. These relatively high fan-out elements can be particularly important to protect with triplication as faults in these elements can cause undesirable issues in relatively large areas of a circuit.

The triplication selection module 440 shown in FIG. 4 can be used to select subsets for triplication. In some implementations, the triplication selection module 440 can be configured to select subsets for triplication after processing has been performed by representation processor 410, the subset definition module 420, and the ranking module 430. The triplication selection module 440 can be configured to select subsets for triplication based on triplication conditions 40 and based on the ranking-ordering based on the ranking rules 42.

In some implementations, one or more of the triplication conditions 40 can be based on a number of elements (or subsets) (e.g., a threshold number of elements, a limit or quota of elements). For example, the triplication selection module 440 can be configured to select rank-ordered subsets starting with the highest ranked subsets and continuing through to the lowest rank subsets until an element threshold or limit has been satisfied. In some implementations, limit can be an element level limit even though the rank-ordering is based on subsets. In some implementations, the limit can be a subset limit.

In some implementations, one or more of the triplication conditions 40 can be based on a limit or condition for a type of element or subset. For example, one of the triplication conditions 40 can be defined such that only a certain number of a type of element may be triplicated from one or more subsets. The rank-ordering can be used to satisfy the quota or limit of the particular type of element.

In some implementations, a subset can be further subdivided to satisfy a quota or a limit. For example, with reference to FIG. 3A, after the rank-ordering has been completed, at least some of the components A1 through A8 from subsets B1 through B4 can be selected for triplication. Selection of components based on rank-ordering shown in FIG. 3B can proceed until a triplication condition is satisfied. If the triplication condition sets a number of components for triplication to five components, selection of the highest ranked subsets— subset B2 and subset B4—will initially result in selection of four components for triplication and the number in the triplication condition will not be met (or satisfied). Specifically, a total of four components are included in subset B2 (including component A3) and subset B4 (including component A1, A2, and A6). Accordingly, at least one additional component from either subset B3 or B4 can be selected for triplication. One or more of the ranking rules (e.g., ranking rules 42) and/or subset rules (e.g., subset rules 41) can be used to further subdivide the subset B3 or B4 to select a component for triplication to meet the limit of five. Accordingly, the triplication module can be configured to iteratively perform subdivision, rank-ordering, and subset selection to satisfy the triplication condition. In some implementations, additional rules (or different combinations of rules or parameters) that were not applied during a first iteration of processing can be applied during a second iteration of processing to select a component for triplication. In some implementations, substitution of a first subset for a second subset can be performed to satisfy one or more triplication conditions.

Referring back to FIG. 4, in some implementations, one or more of the triplication conditions 40 can be based on a size (e.g., area) of elements (or subsets) (e.g., a threshold size). For example, the triplication selection module 440 can be configured to select rank-ordered subsets starting with the highest ranked subsets and continuing through to the lowest ranked subsets until an area condition has been satisfied.

In some implementations, one or more of the triplication conditions 40 can be based on a type of elements (or subsets) (e.g., a threshold size). For example, the triplication selection module 440 can be configured to select rank-ordered subsets starting with the highest ranked subsets and continuing through to the lowest ranked subsets until the element type condition has been satisfied.

Any of the triplication conditions 40 described herein associated with any of the implementation can be used alone or in combination. In some implementations, the triplication conditions 40 can be organized with a prioritization (or ordering) so that a first triplication condition from the triplication conditions 40 can be applied before a second triplication condition from the triplication conditions 40. In some implementations, one or more of the triplication conditions 40 can include an execution order of other of the triplication conditions 40. In some implementations, one or more triplication conditions 40 may not be executed or may be dynamically changed during processing by the triplication module 400.

In some implementations, one or more of the subset rules 41 and/or one or more of the triplication conditions 40 can be applied by the ranking module 430 when ranking subsets. Similarly, one or more of the ranking rules 42 and/or one or more of the triplication conditions 40 can be used by the subset definition module 420 when subdividing the circuit representation 43 into subsets. Similarly, one or more of the ranking rules 42 and/or one or more of the ranking rules 42 can be used by the triplication selection module 440 when selecting (and/or excluding) subsets for triplication. In other words, one or more of the triplication conditions 40, the subset rules 41, and/or the ranking rules 42 can correspond or overlap.

The components (e.g., modules, processors) of the triplication modules (e.g., triplication modules 100, 300, 400) described herein can be configured to operate based on one or more platforms (e.g., one or more similar or different platforms) that can include one or more types of hardware, software, firmware, operating systems, runtime libraries, and/or so forth. In some implementations, the components of the triplication modules can be configured to operate within a cluster of devices (e.g., a server farm). In such an implementation, the functionality and processing of the triplication modules can be distributed to several devices of the cluster of devices.

The components of the triplication modules can be, or can include, any type of hardware and/or software configured to process attributes. In some implementations, one or more portions of the components of the triplication modules can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components the triplication modules can be, or can include, a software module configured for execution by at least one processor (not shown). In some implementations, the functionality of the components of the triplication modules can be included in different modules and/or different components than those shown in the triplication modules.

In some embodiments, one or more of the components of the triplication modules can be, or can include, processors configured to process instructions stored in a memory. For example, the triplication selection module 440 (and/or a portion thereof) can be a combination of a processor and a memory configured to execute instructions related to a process to implement one or more functions.

Although not shown, in some implementations, the components of the triplication modules (or portions thereof) can be configured to operate within, for example, a data center (e.g., a cloud computing environment), a computer system, one or more server/host devices, and/or so forth. In some implementations, the components of the triplication modules (or portions thereof) can be configured to operate within a network. Thus, the components of the triplication modules (or portions thereof) can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some implementations, a memory included in one or more of the triplication modules (not shown) can be any type of memory such as a random-access memory, a disk drive memory, flash memory, and/or so forth. In some implementations, the memory can be implemented as more than one memory component (e.g., more than one RAM component or disk drive memory) associated with the components of the triplication modules. In some implementations, the memory can be a database memory. In some implementations, the memory can be, or can include, a non-local memory. For example, the memory can be, or can include, a memory shared by multiple devices (not shown). In some implementations, the memory can be associated with a server device (not shown) within a network and configured to serve the components of the triplication modules.

Figure 6A:
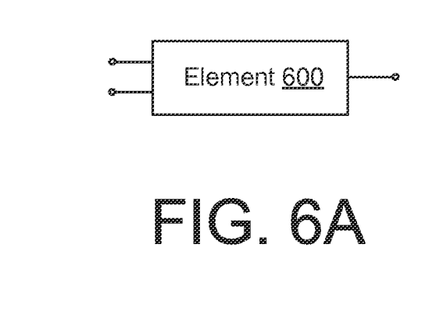
FIGS. 6A and 6B are diagrams that illustrate triplication of an element.
Figure 6B:
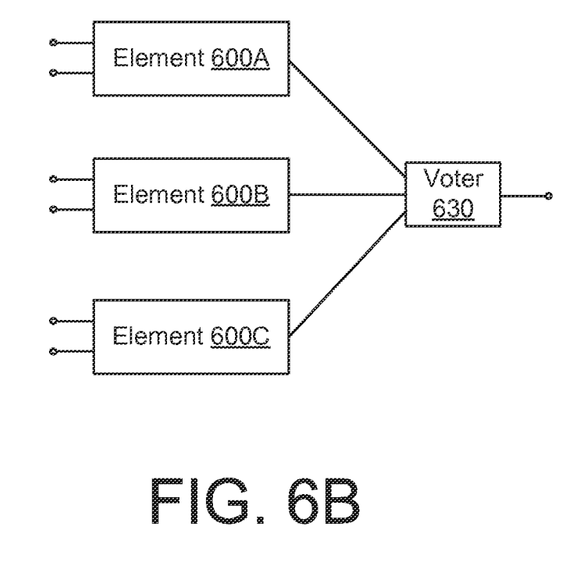

FIGS. 6A and 6B are diagrams that illustrate triplication of an element 600. The element can be, or can represent, a circuit behavior, a circuit portion, a component, a subset, node, and/or so forth. In this example, the element 600 includes two input ports and an output port.

FIG. 6B is a diagram that illustrates triplication of the element 600 shown in FIG. 6A. Instances of the element 600 that are triplicated are labeled 600A, 600B, and 600C. A voter 630 is coupled to the respective output ports of the elements 600A through 600C. In some implementations, the voter 630 can be disposed between the triplicated instances of the element 600A through 600C and a non-triplicated element (not shown). In some implementations, voter 630 can be configured to ensure, for example, proper synchronization between instances of the element 600 and other elements (or portions thereof) that may or may not be triplicated.

Figure 7A:
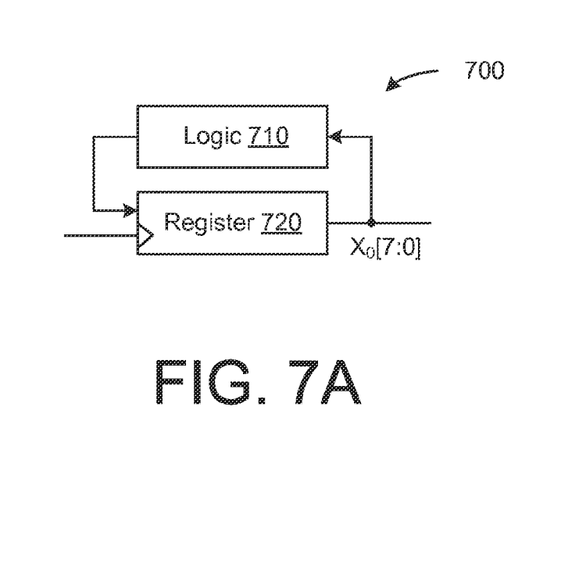
FIGS. 7A and 7B are diagrams that illustrate triplication of feedback of a circuit.
Figure 7B:
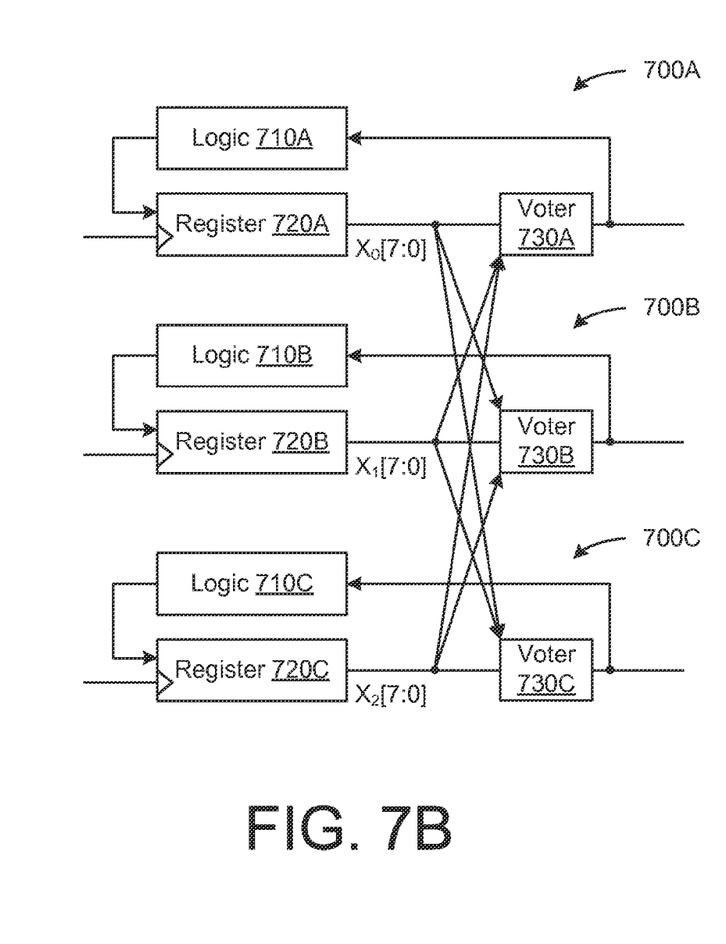

FIGS. 7A and 7B are diagrams that illustrate triplication of feedback of a circuit 700. As shown in FIG. 7A, the circuit 700 includes a register 720 and logic 710 (e.g., accumulator logic, combination logic). A feedback path is from the register 720, through the logic 710, and back to the register 720. If the logic or state of the circuit 700 is corrupted, the feedback of the circuit 700 will preserve the fault and will not restore the correct value of the circuit 700 even after the circuit 700 has been repaired (e.g., repaired through scrubbing).

FIG. 7B is a diagram that illustrates triplication of the circuit 700 shown in FIG. 7A. Each component of the circuit 700 shown in FIG. 7A is triplicated as circuit 700A, circuit 700B, and circuit 700C. Voters 730A, 730B, 730C (e.g., majority voters) are respectively inserted into the feedback path within each of the circuits 700A, 700B, and 700C.

Implementations of the various techniques described herein may be implemented in digital electronic circuitry, or in computer hardware, firmware, software, or in combinations of them. Implementations may implemented as a computer program product (i.e., a computer program tangibly embodied in an information carrier (e.g., in a machine-readable storage device (computer-readable medium) or in a propagated signal, for processing by, or to control the operation of, data processing apparatus (e.g., a programmable processor, a computer, or multiple computers))). A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry (e.g., an FPGA (field programmable gate array) or an ASIC (application-specific integrated circuit)).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data (e.g., magnetic, magneto-optical disks, or optical disks). Information carriers suitable for embodying computer program instructions and data include all forms of non-volatile memory, including by way of example semiconductor memory devices (e.g., EPROM, EEPROM, and flash memory devices; magnetic disks (e.g., internal hard disks or removable disks); magneto-optical disks; and CD-ROM and DVD-ROM disks. The processor and the memory may be supplemented by, or incorporated in special purpose logic circuitry.

To provide for interaction with a user, implementations may be implemented on a computer having a display device (e.g., a liquid crystal display (LCD) monitor), for displaying information to the user and a keyboard and a pointing device (e.g., a mouse or a trackball), by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

Implementations may be implemented in a computing system that includes a back-end component, e.g., as a data server, or that includes a middleware component, e.g., an application server, or that includes a front-end component (e.g., a client computer having a graphical user interface or a Web browser through which a user can interact with an implementation), or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A non-transitory computer-readable storage medium storing instructions that when executed cause a processor to perform a process, the process comprising:
    receiving a representation of a circuit including a plurality of elements and a plurality of relationships;
    defining a first subset of the plurality of elements and a second subset of the plurality of elements based on an analysis of the representation of the circuit;
    assigning a first rank to the first subset of the plurality of elements, and a second rank to the second subset of the plurality of elements;
    receiving a triplication condition for triggering redundancy within the circuit; and
    selecting at least one of the first subset of the plurality of elements or the second subset of the plurality of elements for redundancy based on the first rank, the second rank, and based on the triplication condition.

2. The computer-readable storage medium of claim 1, wherein the analysis is an analysis of a plurality of cycles within the representation of the circuit.

3. The non-transitory computer-readable storage medium of claim 1, wherein the assigning of the first rank is based on a size of the first subset of the plurality of elements.

4. The non-transitory computer-readable storage medium of claim 1, wherein the assigning of the first rank and the second rank is based on fan-out.

5. The non-transitory computer-readable storage medium of claim 1, wherein the assigning of the first rank and the second rank is based on a priority of a component from the first subset of the plurality of elements relative to a priority of a component from the second subset of the plurality of elements.

6. The non-transitory computer-readable storage medium of claim 1, wherein the triplication condition represents a triplication limit.

7. The non-transitory computer-readable storage medium of claim 1, wherein the selecting includes selecting the first subset of the plurality of elements,
    the process further comprising:
    triplicating a portion of the first subset of the plurality of elements based on the triplication condition.

8. The non-transitory computer-readable storage medium of claim 1, wherein the selecting includes selecting the first subset of the plurality of elements,
    the process further comprising:
    subdividing the first subset of the plurality of elements into a first portion and a second portion based on the triplication condition; and
    excluding the first portion of the first subset of the plurality of elements from redundancy.

9. The non-transitory computer-readable storage medium of claim 1, wherein the selecting includes selecting the first subset of the plurality of elements,
    the process further comprising:
    excluding the second subset of the plurality of elements from redundancy based on the first rank having a priority greater than a priority of the second rank.

10. The non-transitory computer-readable storage medium of claim 1, wherein the first subset of the plurality of elements is mutually exclusive from the second subset of the plurality of elements.

11. The non-transitory computer-readable storage medium of claim 1, wherein the defining includes defining based on strongly connected component (SCC) decomposition.

12. The non-transitory computer-readable storage medium of claim 1, wherein the representation of the circuit is derived from a netlist, the plurality of elements correspond with a plurality of components of the circuit, the plurality of relationships represent a plurality of directional connections between the plurality of components of the circuit.

13. The non-transitory computer-readable storage medium of claim 1, wherein the redundancy includes partial redundancy.

14. The non-transitory computer-readable storage medium of claim 1, wherein the redundancy includes partial triple modular redundancy.

15. A non-transitory computer-readable storage medium storing instructions that when executed cause a processor to perform a process, the process comprising:

defining a plurality of subsets from a representation of a circuit;

rank-ordering each subset from the plurality of subsets; and selecting at least one of the subsets for redundancy based on the rank-ordering and a triplication condition, the triplication condition configured to trigger the redundancy within the circuit.

16. The non-transitory computer-readable storage medium of claim 15, wherein the defining is based on an analysis of a plurality of cycles within the representation of the circuit.

17. The non-transitory computer-readable storage medium of claim 15, wherein the representation of the circuit includes an element that represents a behavior of a circuit.

18. The non-transitory computer-readable storage medium of claim 15, wherein the plurality of subsets from the representation of the circuit include a plurality of elements and a plurality of relationships.

19. The non-transitory computer-readable storage medium of claim 15, wherein the ranking-ordering includes rank-ordering based on a plurality of ranking rules.

20. A non-transitory computer-readable storage medium storing instructions that when executed cause a processor to perform a process, the process comprising:

defining a plurality of subsets from a representation of a circuit including a plurality of elements and a plurality of relationships;

rank-ordering each subset from the plurality of subsets; and iteratively selecting subsets from the plurality of subsets for redundancy based on the rank-ordering until a triplication condition is satisfied, the triplication condition configured to trigger redundancy within the circuit.

21. The non-transitory computer-readable storage medium of claim 20, wherein the ranking-ordering includes rank-ordering based on a plurality of ranking rules.

22. The non-transitory computer-readable storage medium of claim 20, wherein the iteratively selecting subsets includes iteratively selecting a portion of at least one of the subsets to satisfy the triplication condition.

* * * * *